(12) United States Patent
Huang et al.

(10) Patent No.: US 6,924,083 B2
(45) Date of Patent: Aug. 2, 2005

(54) MASK LAYOUT AND EXPOSING METHOD FOR REDUCING DIFFRACTION EFFECTS BY USING A SINGLE MASK IN THE PROCESS OF SEMICONDUCTOR PRODUCTION

(75) Inventors: Hao-Min Huang, Tao-Yuan (TW); Chen-Tung Huang, Tao-Yuan (TW)

(73) Assignee: Tai-Saw Technology Co., Ltd., Tao-Yuan (TW)

( * ) Notice: Subject to any disclaimer, the term of this patent is extended or adjusted under 35 U.S.C. 154(b) by 67 days.

(21) Appl. No.: 10/273,267

(22) Filed: Oct. 18, 2002

(65) Prior Publication Data

US 2004/0076889 A1 Apr. 22, 2004

(51) Int. Cl.[7] ................................................. G03C 5/00
(52) U.S. Cl. ........................................ 430/296; 430/394
(58) Field of Search ............................. 430/5, 30, 394, 430/296

(56) References Cited

U.S. PATENT DOCUMENTS 5,972,568 A * 10/1999 Seniuk et al. ............... 430/312

* cited by examiner

Primary Examiner—Mark F. Huff
Assistant Examiner—Saleha Mohamedulla
(74) Attorney, Agent, or Firm—Rosenberg, Klein & Lee (57) ABSTRACT

The present invention discloses appropriate layout design of a single mask and proper operation of exposing device in the process of semiconductor production for reducing diffraction effects caused by tiny pattern in exposing process, therefore effectively enhances the resolution in exposing process, and increases the yield.

19 Claims, 6 Drawing Sheets

MASK LAYOUT AND EXPOSING METHOD FOR REDUCING DIFFRACTION EFFECTS BY USING A SINGLE MASK IN THE PROCESS OF SEMICONDUCTOR PRODUCTION

BACKGROUND OF THE INVENTION

1. Field of the Invention

The present invention relates to a mask layout and exposing device in the process of semiconductor production, and more particularly to a symmetrical layout using pattern of a single mask and the method of the same.

2. Description of the Prior Art

During the last decade, due to the prospering wireless communication industry, the band of electromagnetic wave used has reached that of microwave, 1 GHz~300 GHz. And under the trend of minimization of products, the need of microwave elements, such as filter, surface acoustic wave device, and spiral inductor on some active elements, has increased. With the aid of fast-developing technique of semiconductor production, the trend drives on the mass production and low price of microwave elements, matching the elements with the commercial demand at a high speed. However, as the frequency range of microwave elements increases, concerning product integration and cost of production equipment, there are some lithography problems encountered in the process of microwave element production. The most difficult one is diffraction effects produced in exposing process.

Because of diffraction effects in the lithography process, in addition to the normally incident rays of light, some light propagates at divergent angles. As device geometries shrink, the phenomenon will result in sufficient resolution. Therefore when tiny pattern is exposed, there will be incomplete exposure on photoresist formed on the chip, and due to the spread of illuminant energy, there will be a chemical change on the photoresist, which, originally, does not need exposure. It will result in organic residue or incomplete shape of overhang or T-Top after development process, and thus affects following lift-off process. The organic residue may cause poor adhesion of thin film, such that the metal film peels off easily. The lift-off may be incomplete and thus causes residual metal film. In these situations, the elements will have short circuits or incomplete contacts, and thus become failure products.

Take a surface acoustic wave device (SAW) that has the simplest process of production for example. Surface acoustic wave is an elastic wave that spread along the surface of a solid body, the elliptical locus of which is composed by longitudinal wave and shear wave. Its largest amplitude is on the surface of a solid body and declines exponentially as the wave goes deeper, so 90% of the mechanical energy it transmits centers on the depth of about one wavelength. The basic functioning principle of SAW is to transduce input electric signal into acoustic signal by interdigital transducer (IDT) through reverse voltage effects and the acoustic signal is transmitted along the surface of piezoelectric substrate and then transduced into output electric signal by IDT through positive piezoelectricity effects. Thus SAW is a signal processing device on piezoelectric substrate using the principle of transducing acoustic and electric energy.

The electrical performance of SAW basically corresponds with geometrical pattern of IDT, the center frequency of which depending on the width of interval of periodic IDT, the phase of which corresponding with the position of IDT, and the amplitude of which corresponding with the length of overlaying of IDT.

The focus of discussion is then concentrated on the distance between adjacent IDT. According to the above mentioned, the center frequency of SAW depends on the interval of IDT. Generally speaking, it can be decided by the following equation, $$V = f0 \lambda,$$

in which

V is the SAW acoustic velocity of piezoelectric substrate;
f0 is the center frequency of SAW device;
λ is the wavelength of SAW device.

For a SAW filter operating at 2.5 GHz, with piezoelectric substrate Lithium Tantalate having an acoustic velocity of about 4000 m/s, the wavelength (λ) of said SAW filter is about 1.6 μm based on the above equation. The width of interval of adjacent IDT on SAW filter (d) is generally designed to be one-fourth of the wavelength (λ/4), therefore the interval of adjacent IDT can be further figured out to be 0.4 μm. If the center frequency of SAW filter is designed to be higher, for example, 5 GHz, then under the premise that the conditions above do not change, the interval of adjacent IDT of SAW filter will be down to 0.2 μm.

In semiconductor industry, it is very common to fabricate 0.4 μm (even lower) linewidth device by using advanced stepper, but it is very difficult to justify to invest such expensive stepper for economically manufacturing SAW devices. Hence, so-called cost-effective I-Line stepper with optimum resolution 0.4~0.7 μm became the main exposer in SAW industry. However, when to produce a SAW filter having the center frequency of 2.5 GHz by I-Line stepper, there will be diffraction effects in the exposure, so decreases the yield of products.

In order to overcome the exposing restrictions imposed by diffraction, a "Method of Making Surface Wave Devices" is disclosed in U.S. Pat. No. 5,972,568, the feature of which is to divide IDT on surface acoustic wave into two subsets and provide the two subsets on the same mask. The fabrication methods can be illustrated by FIGS. 1a to 1c.

Typically, the lithography process is to divide a wafer into a plurality of shots, then the exposure is proceeded along X axis or Y axis by exposer, and one exposure is made through projection each time the exposer moves for a distance of one shot. In the producing method FIG. 1a, the first part of IDT pattern on reticle will be exposed one shot after another by blinding the second part. After the exposure of all shots is completed, the exposer will return to the starting position (first shot) and then the second part of IDT pattern is exposed one shot after another by blinding the first part. Finally, the exposure of the whole IDT pattern of surface acoustic wave element is completed, and the following procedure is then proceeded. Since the first and second parts symmetrically divide IDT pattern into two parts, the interval of adjacent IDT on the first and second parts is increased from 0.4 μm to 0.8 μm. As the interval of adjacent IDT increases, the diffraction effects can be reduced effectively, but time for exposure also doubles. Besides, it is emphasized in the patent that the method claims precise alignment and does not have the problem of overlaying. In fact, owing to that the exposures of the first and second parts are proceeded consecutively without development process between, there is no alignment key on the chip for the recognition of pattern's position. After the wafer stage moved lot of shots for the exposure of first part and returned to starting position for the exposure of second part, there is still inaccuracy of displacement in the practical operation of exposer. Consequently, in the process of FIG. 1a, when the patterns of first and second parts are exposed, it is very difficult to control their relative overlaying positions. Maybe for this reason, another producing method that can control the alignment of relative overlaying position of two parts is disclosed in the patent, referring to FIG. 1b.

Figure 1A:
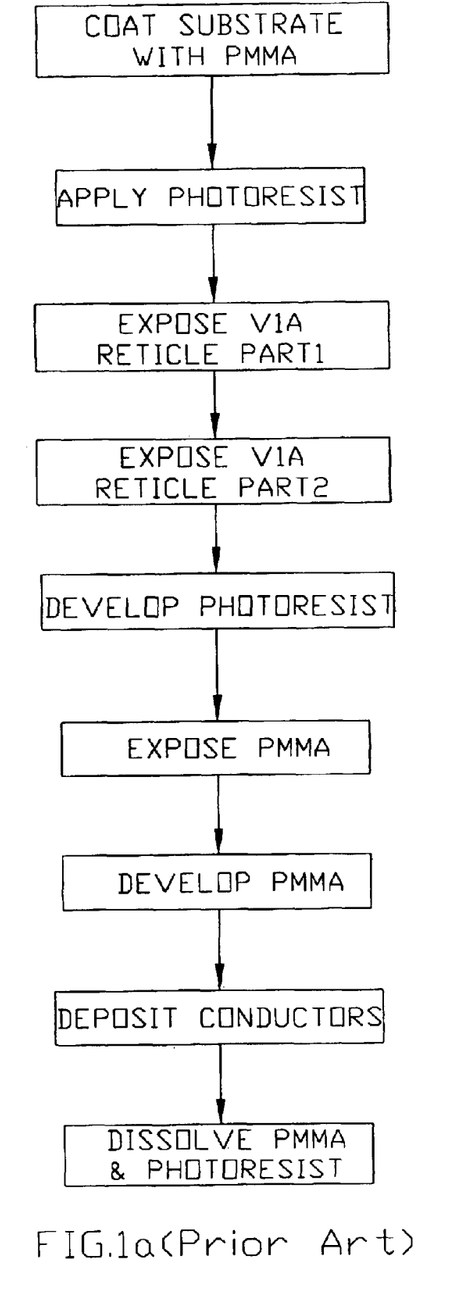
FIG. 1a to FIG. 1c are diagrams of prior techniques.
Figure 1B:
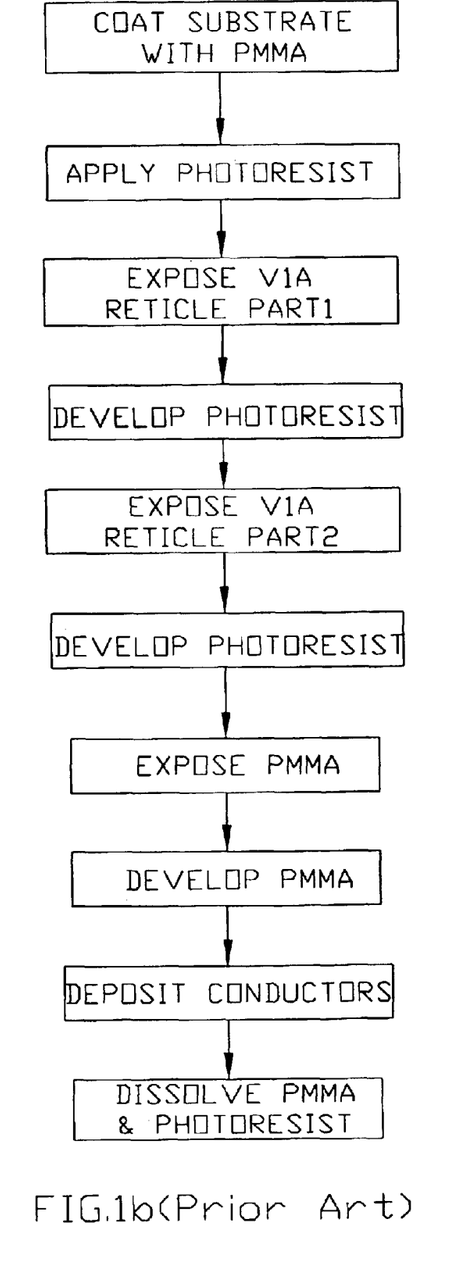

Comparing FIG. 1b with FIG. 1a, the largest difference is that after the exposure of the first part on reticle is completed, the development process is made to form an alignment key on the chip. After the exposure of first part is completed and the wafer stage returns to the starting position (first shot), the recognition of pattern's position will be made according to the alignment key, and then the exposure of second part is then proceeded. Therefore, the exposing result of FIG. 1b will be more precise than that of FIG. 1a, but comparing with the production time of FIG. 1a, there will be additional time needed for one development and one in/out of exposer in that of FIG. 1b.

Figure 1C:
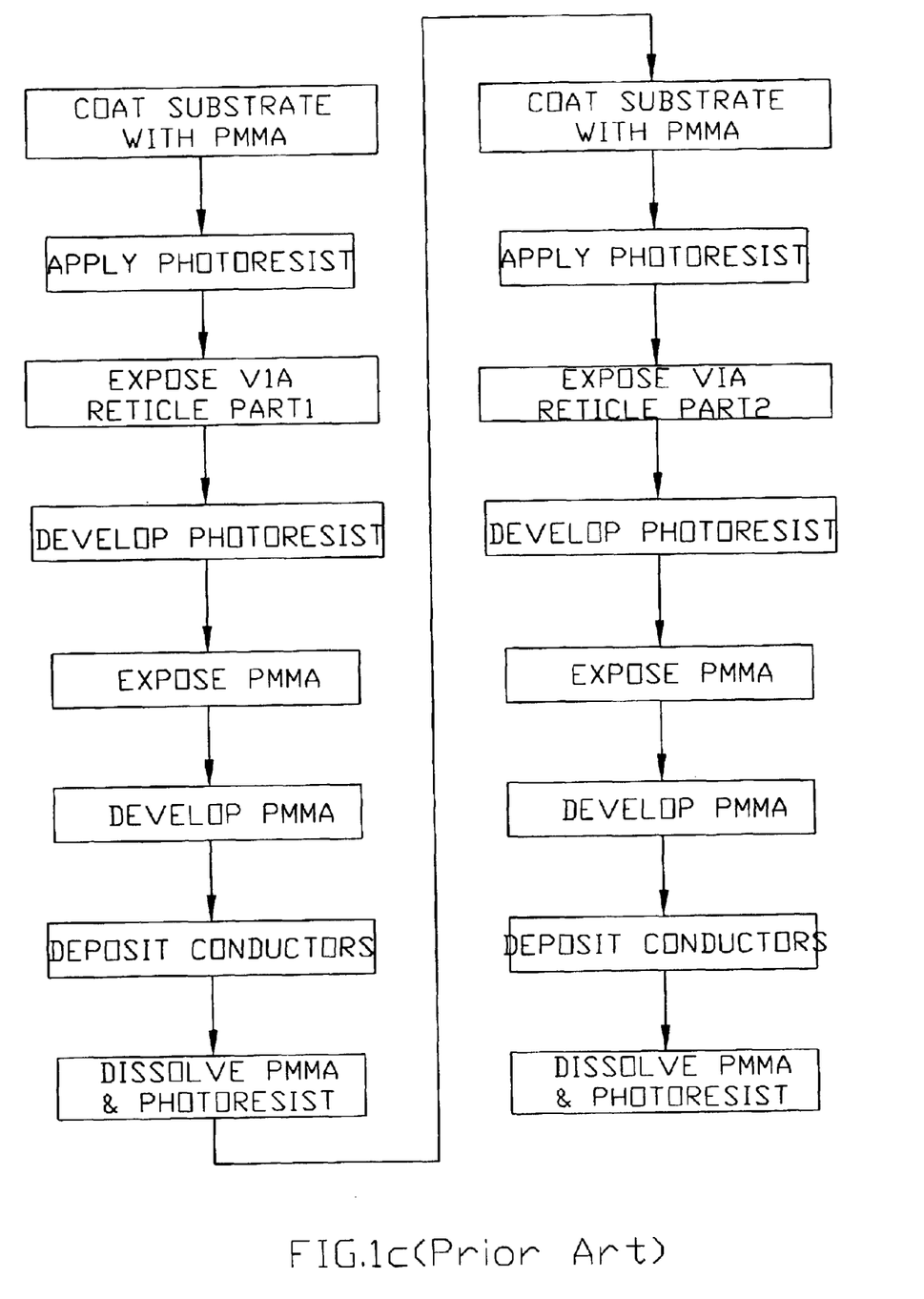

In addition, another optional producing method is also disclosed in the patent, referring to FIG. 1c. The difference from FIG. 1a and FIG. 1b is that after the IDT of first part is produced by exposed, developed, deposited with metal and lift-off, the wafer is then returned to the exposer for the exposure of second part. Since an alignment key has been created on the chip, the pattern recognition will be made first after the wafer is returned to the exposer for exposure of second part, and the following procedure of production is then made. Although more precise overlaying result can be obtained in FIG. 1c, one additional producing procedure of IDT has to be made, which means at least eight more process items in the procedure.

Obviously, the diffraction effects can be reduced by the producing methods disclosed in the prior paten, but there is still great possibility for improvement in the aspects of pattern alignment method and production cycle time.

SUMMARY OF THE INVENTION

Concerning the defect of diffraction effects caused by tiny pattern in the lithography process in the above background of invention, the present invention discloses a mask layout and exposing method to reduce diffraction effects in semiconductor production. The disclosure can contribute to the resolution enhancement in lithography process and higher product yield without increasing the number of mask and production time.

In the present invention, with appropriate design of mask layout and proper operation of exposing method in the process of semiconductor production, the diffraction effects caused by tiny pattern in lithography process can be reduced. The feature of mask layout is to divide one tiny pattern on a mask into two patterns located on two equal sections of the same mask through symmetrical design. Based on such mask layout, the two patterns will have wider interval of adjacent IDT than that of original tiny pattern. By using stack exposure and controlling the displacement of each exposure shot, the original tiny pattern can be created. The merits of such mask layout are that the resolution in exposing process can be effectively enhanced and the yield of product can be increased without increasing the number of mask, almost without increasing the time of production, and furthermore, without concerning the problem of alignment of pattern.

The present invention first provides a mask layout that reduces diffraction effects in semiconductor production, on which are two equally divided symmetrical patterns located on two sections of the same mask substrate.

The present invention further provides an exposing method that reduces diffraction effects in the process of semiconductor production, comprising: providing a mask having two sections with pattern matching being equally divided on said mask, only the light of specific energy produced by an exposer being able to go through according to the layout pattern on said mask section in exposing process; exposing a chip, said exposing procedure using said mask, one exposure being made to a first shot by said exposer to expose pattern of second section of the mask on the right half of said first shot; then said exposer moving for a distance of half shot in continual exposing procedure; then, exposing said chip for the second time, said second exposing procedure using said mask, another exposure being made to said first shot by said exposer to expose pattern of first section of the mask on the right half of said first shot to make a complete pattern.

DESCRIPTION OF THE PREFERRED EMBODIMENT

The following is detailed description of the present invention. In the description of semiconductor production in the following, the complete process of exposure and of producing products is not included. The prior arts used continually by the present invention are only summarized to support the description of the present invention. All the diagrams used in the present invention are only to illustrate the mask layout and feature of exposing method in the present invention and not made in practical proportions.

The present invention first provides a mask layout that reduces diffraction effects in semiconductor production, on which are two equally divided symmetrical patterns located on two sections of the same mask substrate.

The present invention further provides an exposing method that reduces diffraction effects in the process of semiconductor production, comprising: providing a mask having two sections with pattern matching being equally divided on the mask, only the light of specific energy produced by an exposer being able to go through according to the layout pattern on the mask section in exposing process; exposing a chip, the exposing procedure using the mask, one exposure being made to a first shot by the exposer to expose pattern of second section of the mask on the right half of the first shot; then the exposer moving for a distance of half shot in continual exposing procedure ; then , exposing said chip for the second time, the second exposing procedure using the mask, another exposure being made to said first shot by said exposer to expose pattern of first section of the mask on the right half of said first shot to make a complete pattern.

In order to disclose the difference between the present invention from the prior technique, the process of producing IDT of SAW filter is mainly used to illustrate the difference in the following detailed description.

Figure 2A:
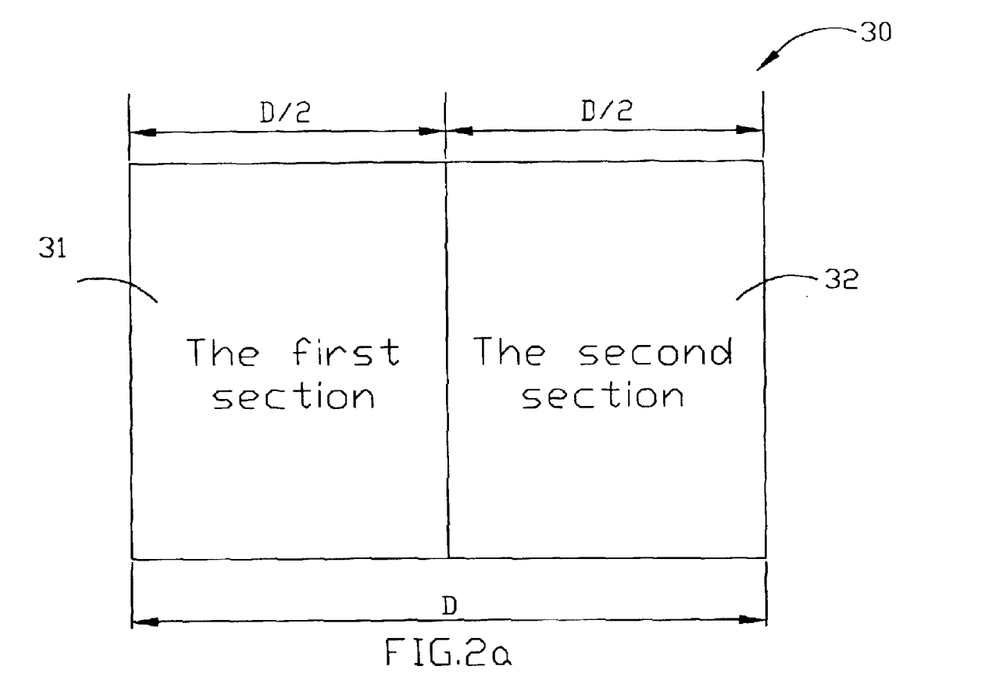
FIG. 2a and FIG. 2b are diagrams of mask layout of the present invention.
Figure 2B:
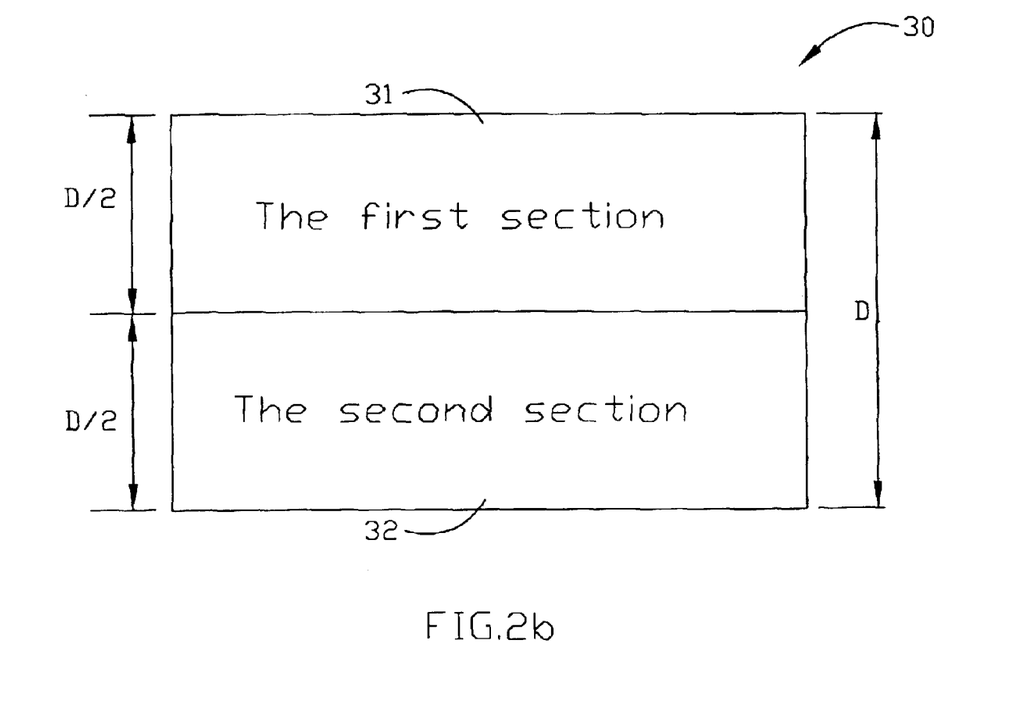

What is shown in FIG. 2a and FIG. 2b is layout on a mask of the present invention. The mask is equally divided into two sections, including the first section and the second section, in which are a plurality of identical patterns. Furthermore, patterns in the first section and second section are symmetrical but not identical patterns. A complete pattern can be created after stack exposing procedure of the first and second section is finished. Take SAW filter for example. After the stack exposure of patterns on the first and second sections is finished, a complete pattern of IDT can be obtained. Besides, in the layout of mask of the present invention, the symmetrical pattern in each section is not confined to oblong. For example, in order to equip surface acoustic wave element with larger amplitude, the shape of IDT can be designed as symmetrical pattern with appropriate radian. For another example, in order to make a circle or square spiral inductor on an active element (such as power amplifier; PA), the pattern can be designed to be symmetrical with circle or square.

Figure 3A:
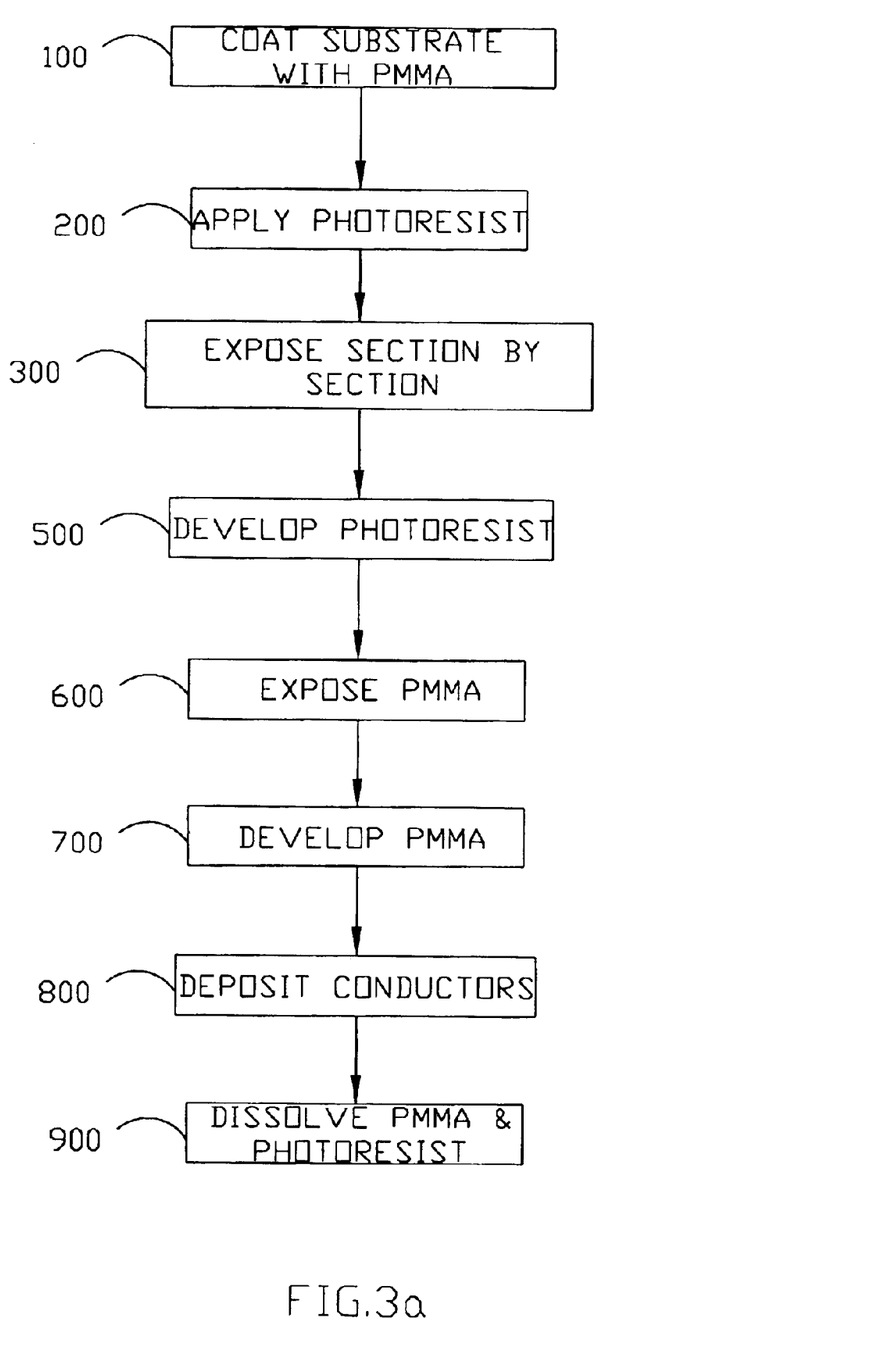
FIG. 3a is a flow chart of process of the present invention.
Figure 3B:
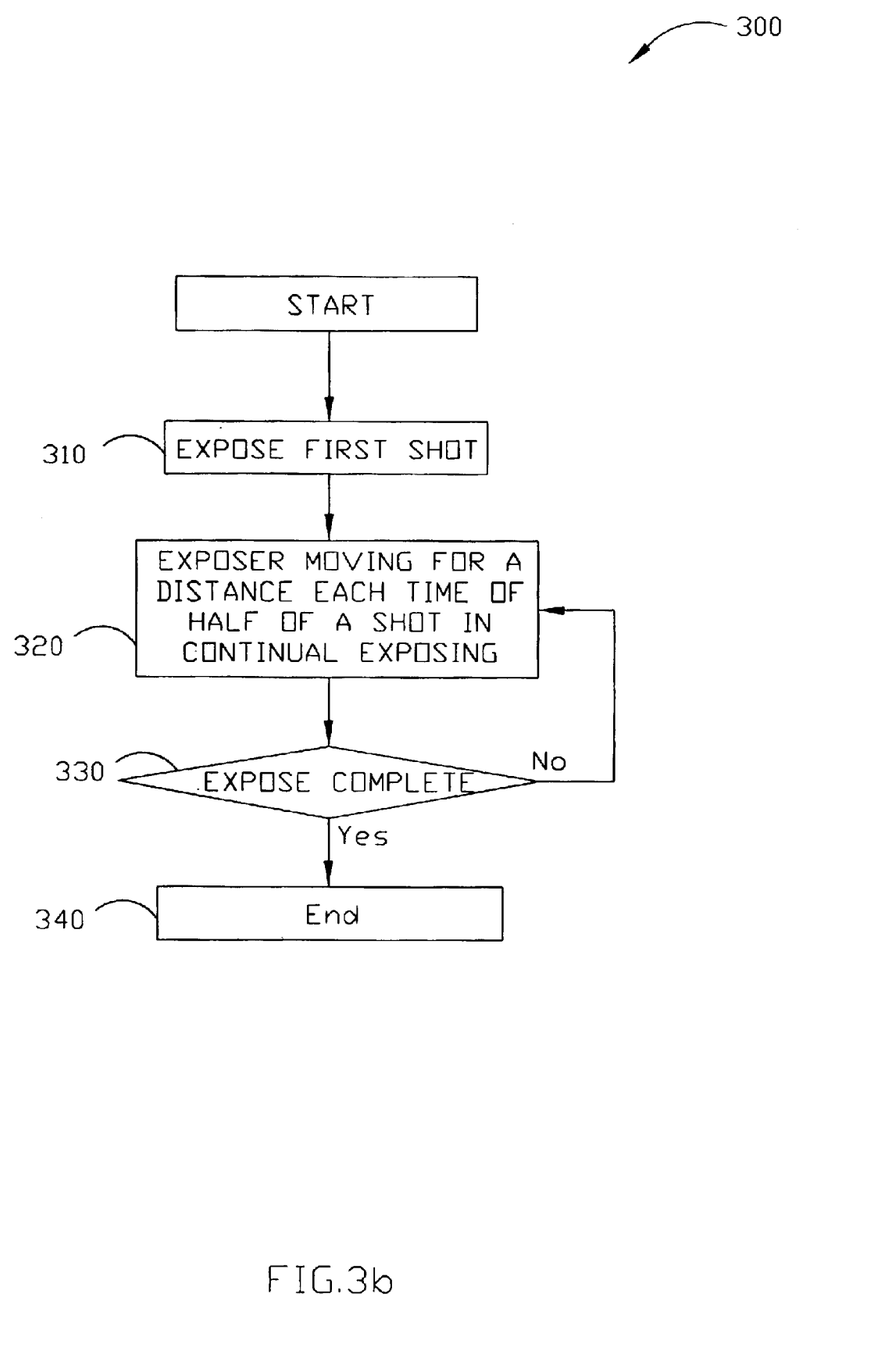
FIG. 3b is a flow chart of exposure of the present invention.

FIG. 3a is a procedure for producing IDT of SAW filter of the present invention, and FIG. 3b is a detailed sub-procedure of exposing procedure 300 in FIG. 3a, describing exposing method of the present invention. Generally speaking, in the lift-off process of producing metal thin-film, usually the process of two layers of photoresist is chosen to achieve the undercut profile. First, a lower photoresist 100 is coated on a wafer. In order to achieve lift-off effect, the lower photoresist 100 is usually PMMA or PMGI. After soft-baking, a photoresist layer 200, usually being positive photoresist, is coated. The wafer is then set in the wafer stage and carried to the exposing position. After layout direction of the mask is decided, an exposing procedure 300 is proceeded.

Figure 4:
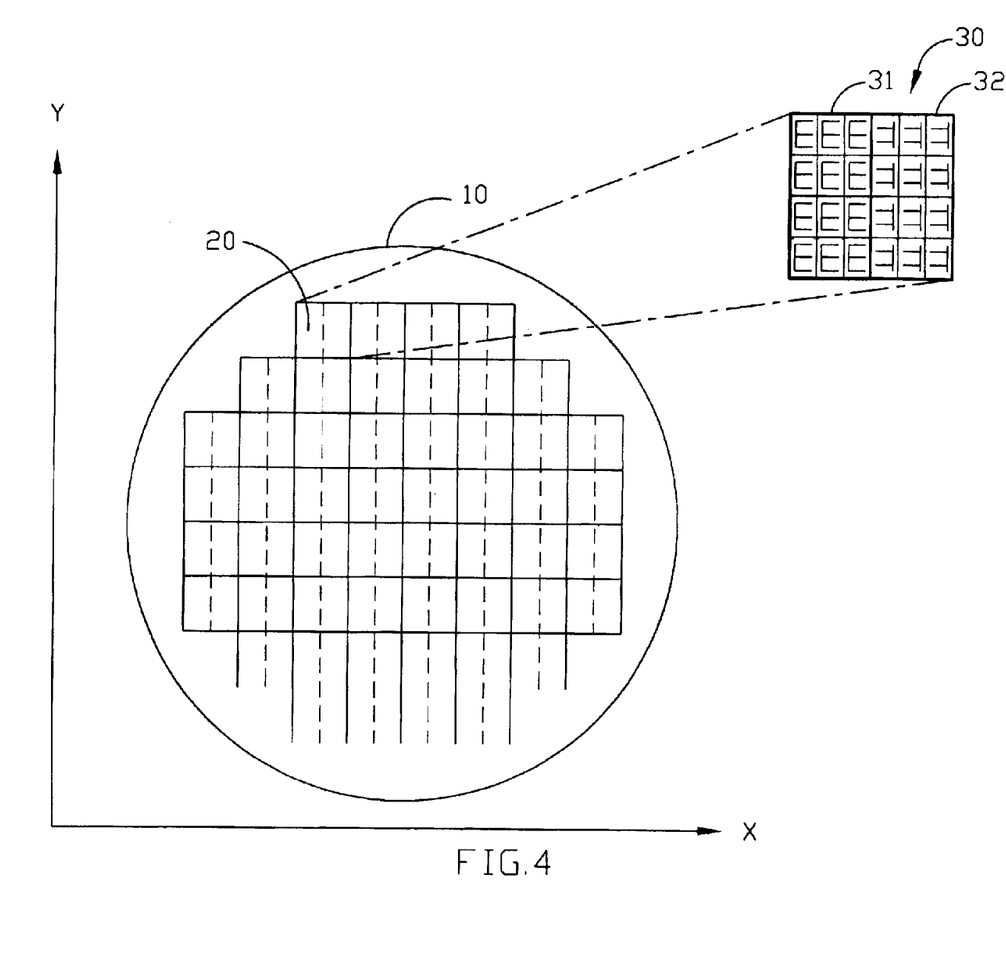
FIG. 4 is a diagram of position of chip and mask in exposing process of the present invention.

Exposing procedure is illustrated by FIG. 3b and FIG. 4. The exposing method of the present invention sets the distance that each time the exposer's stage (which is not displayed in the FIG. 4) carries wafer 10 to move to be "half of a shot 20." Take the exposure of IDT for example. Procedure 310 is first carried out after an exposer receives exposing command, one exposure being made to a first shot. Therefore on the left half of the first shot is exposed through pattern of the first section 31 on a mask 30, and on the right half of the first shot is exposed through pattern of the second section 32 on mask 30. A procedure 320 is then carried out, the exposer moving for a distance of half of the shot in the direction of X axis and another exposure being made; at this time, on the right half of first shot is exposed through pattern of the first section 31 on mask 30, a complete pattern of IDT being finished on the right half of first shot, and on the left half of second shot is exposed through pattern of the second section 32 on mask 30; after the exposer makes another displacement along the X axis (or moving a distance of half of the shot to the right) and carries out another exposure, on the left half of second shot is exposed through pattern of first section 31 on mask 30, the IDT being completed, and on the right half of second shot is exposed through pattern of second section 32 on mask 30. Then with this method, a continual exposing procedure is carried out by using the controlling precision of the displacement of exposer itself, and the exposing procedure of IDT pattern on the whole wafer is completed in a way similar to stake exposure.

Since the present invention carries out continual exposing procedure by controlling precision of displacement of exposer itself, the problem of overlaying and alignment of the first section 31 and the second section 32 in the exposing process can be completely solved. Besides, the total moving distance of exposer for the exposure of whole wafer is not increased, so production time is still controllable. Therefore, the exposing method of the present invention effectively reduces the diffraction effects without the problem of overlaying and alignment of pattern or need of extending production time. In other words, the process capability of line width can be reduced to a half, and IDT with smaller line width can be produced by using the original equipment with the mask layout and operation of exposing method described by the present invention.

After the exposure of wafer 10 is completed, development 500 is then carried out for an upper photoresist. Wafer 10 is then sent to deep UV aligner for flood exposure process 600 and developed by process 700. Since the diffraction effects have been reduced, after the development of upper/lower photoresist is completed, overhang or T-Top profile on upper photoresist can be observed from a microscope or scanning electron microscope (SEM). An appropriate undercut is suitable for lift-off process. Hence, after the evaporation of a metal thin-film layer 800 is completed, upper/lower photoresist 900 can be easily removed to create a fine IDT pattern on wafer 10.

In the mask layout and exposing method described in the present invention, a continual stack exposure is carried out on the upper photoresist based on the controllable precision of exposer itself, so there is no problem of overlaying and alignment of pattern. In FIG. 1a, two times of exposure are carried out on the upper photoresist, therefore, not only the time of exposure is longer, but there is also a problem overlaying and alignment of pattern. In FIG. 1b, although the problem of overlaying and alignment of pattern is solved, the time of production is longer than that of FIG. 1a. Therefore, the present invention, comparing with the prior technique, is obviously more advanced and commercially applicable.

Although the producing method of IDT of specific frequency, of specific linewidth, and of SAW is described in the present invention, the method of the present invention is not limited in these descriptions. The mask layout and exposing method described in the present invention can also be applied in the process of producing other products. The preferred examples include: illuminant elements, such as vertical cavity surface emitted laser(VCSEL), laser diode (LD), and light emitted diode (LED) of high illumination, positive and negative electrodes on these elements already using structure of IDT to achieve the best uniform distribution of electric currents and thus enhance radiation effects of elements. Besides, square or circle coiling and higher coiling density are used in the process of producing spiral inductor on microwave element to achieve higher inductor value and higher Q factor.

All mentioned above are several preferred embodiments of the present invention and they are not to be confined to what is claimed by the present invention. To those who are skilled in this technological field, it is easy to understand and to put into practice. Therefore, those equal-effect changes or modifications completed within the spirits displayed in the invention should be included in what is claimed as follows.

What is claimed is:

1. An exposing method that reduces diffraction effects in the process of semiconductor production, comprising:
providing a mask having two sections with pattern matching being equally divided on said mask, only the light of specific energy produced by an exposer being able to go through according to a layout pattern on a mask section in an exposing process;
performing a first exposure on a chip using said mask, wherein said first exposure being carried out to a first shot by said exposer to expose a pattern of a second section of said mask on a half of said first shot;

moving said exposer for a distance of half of a shot in continual exposing procedure; and performing a second exposure on said chip using said mask, wherein said second exposure being carried out by said exposer to expose a pattern of a first section of said mask on said half of said first shot to finish a complete pattern.

2. An exposing method for reducing diffraction effects in the process of semiconductor production, comprising: providing a mask having two pattern matching sections being divided on said mask, only light of specific energy launched by an exposer being able to go through according to a layout pattern on a mask section in an exposing process;

performing a first exposure on a chip using said mask, wherein said first exposure being carried out to a first shot by said exposer to expose a pattern of a first section of said mask on a half of said first shot and a pattern of a second section of said mask on the other half;

moving said exposer for a distance of half of a shot in a continual exposing procedure; and performing a second exposure on said chip using said mask, wherein said second exposure being carried out by said exposer to expose pattern of first section on said mask on a half of said first shot to finish a complete pattern, and pattern of second section on said mask being exposed on a half of second shot.

3. The exposing method according to claim 2, wherein said exposer is selected from the group consisting of an optical stepper, scanner, an X-Ray lithography tool, and an E-Beam Lithography tool.

4. The exposing method according to claim 2, wherein said exposer can be set to carry out one exposure each time after its stage moves, transversely or longitudinally, for a distance of half of a shot.

5. The exposing method according to claim 2, wherein said two sections are divided on the same mask substrate in said layout pattern, said first pattern section and said second pattern section having a pattern matching said first pattern being deployed on said two sections.

6. The exposing method according to claim 5, wherein said two patterns with matching structure in said pattern sections on said two sections on said mask layout can be any kind of matching pattern.

7. The exposing method according to claim 5, wherein said two patterns with matching structure in said pattern sections on said two sections on said mask can be transversely matching or longitudinally matching.

8. An exposing method for reducing IDT diffiaction effects in the process of semiconductor production comprising:

providing a mask having two pattern matching sections being divided on said mask, only light of specific energy launched by an exposer being able to go through according to a layout pattern on a mask section in an exposing process;

performing a first exposure on a chip using said mask, wherein said first exposure being carried out to a first shot by said exposer to expose a pattern of a first section of said mask on a half of said first shot and a pattern of a second section of said mask on the other half;

moving said exposer for a distance of half of a shot in a continual exposing procedure; and performing a second exposure on said chip using said mask, wherein said second exposure being carried out by said exposer to expose said pattern of said first section on said mask on a half of said first shot to finish a complete pattern, and said pattern of a said second section on said mask being exposed on half of a second shot.

9. The exposing method according to claim 8, wherein said exposer is selected from the group consisting of an optical stepper, scanner, an X-Ray lithography tool, and an E-Beam Lithography tool.

10. The exposing method according to claim 8, wherein said exposer can be set to carry out one exposure each time after it moves, transversely or longitudinally, for a distance of half of a shot.

11. The exposing method according to claim 8, wherein said two sections are divided on a same mask substrate in said mask layout, a first pattern section and a second pattern section having pattern matching said first pattern being deployed on said two sections.

12. The exposing method according to claim 11, wherein said two patterns with matching structure in said pattern sections on said two sections on said layout pattern can be any kind of matching pattern.

13. The exposing method according to claim 11, wherein said two patterns with matching structure in said pattern sections on said two sections on said mask can be transversely matching or longitudinally matching.

14. An exposing method for reducing diffraction effects in inductor production in the process of semiconductor production, comprising:

providing a mask having two pattern matching sections being divided on said mask, only light of specific energy launched by an exposer being able to go through according to the layout pattern on a mask section in an exposing process;

performing a first exposure on a chip using said mask, wherein said first exposure being carried out to a first shot by said exposer to expose a pattern of a first section of said mask on a half of said first shot and a pattern of a second section of said mask on the other half;

moving said exposer for a distance of half of a shot in a continual exposing procedure; and performing a second exposure on said chip using said mask, wherein said second exposure being carried out by said exposer to expose said pattern of said first section on said mask on a half of said first shot to finish a complete pattern, and said pattern of said second section on said mask being exposed on a half of a second shot.

15. The exposing method according to claim 14, wherein said exposer is selected from the group consisting of an optical stepper, scanner, an X-Ray lithography tool, and an E-Beam Lithography tool.

16. The exposing method according to claim 14, wherein said exposer can be set to carry out one exposure each time after it moves, transversely or longitudinally, for a distance of half of a shot.

17. The exposing method according to claim 14, wherein said two sections are divided on a same mask substrate in said layout pattern, a first pattern section and a second pattern section having pattern matching said first pattern being deployed on said two sections.

18. The exposing method according to claim 17, wherein said two patterns with matching structure in said pattern sections on said two sections on said mask layout can be any kind of matching pattern.

19. The exposing method according to claim 17, wherein said two patterns with matching structure in said pattern sections on said two sections on said mask can be transversely matching or longitudinally matching.

* * * * *